United States Patent
Kim et al.

(10) Patent No.: US 10,244,622 B2
(45) Date of Patent: Mar. 26, 2019

(54) DISPLAY DEVICE AND MANUFACTURING METHOD THEREOF

(71) Applicant: SAMSUNG DISPLAY CO., LTD., Yongin-si, Gyeonggi-do (KR)

(72) Inventors: Byoung Yong Kim, Seoul (KR); Jeong Ho Hwang, Cheonan-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/677,505

(22) Filed: Aug. 15, 2017

(65) Prior Publication Data

US 2018/0063942 A1 Mar. 1, 2018

(30) Foreign Application Priority Data

Aug. 30, 2016 (KR) .................. 10-2016-0110912

(51) Int. Cl.
| | |
|---|---|
| *H05K 1/02* | (2006.01) |
| *H05K 1/14* | (2006.01) |
| *H05K 3/46* | (2006.01) |
| *H01L 23/31* | (2006.01) |
| *H01L 27/32* | (2006.01) |

(Continued)

(52) U.S. Cl.
CPC ....... *H05K 1/028* (2013.01); *G02F 1/133305* (2013.01); *H01L 23/3171* (2013.01); *H01L 27/32* (2013.01); *H01L 51/0097* (2013.01); *H05K 1/147* (2013.01); *H05K 3/4691* (2013.01); *H01L 2251/5338* (2013.01); *H05K 2201/055* (2013.01)

(58) Field of Classification Search
CPC ...... H05K 1/028; H05K 1/147; H05K 3/4691; H05K 2201/055; G02F 1/133305; H01L 23/3171; H01L 27/32; H01L 51/0097; H01L 2251/5338
USPC ......................................... 361/749
See application file for complete search history.

(56) References Cited

U.S. PATENT DOCUMENTS

2012/0176564 A1* 7/2012 Hatakeyama ......... G02F 1/1345
349/62
2012/0314383 A1* 12/2012 Oohira ................ G02F 1/13452
361/749

(Continued)

FOREIGN PATENT DOCUMENTS

| JP | 11-305250 A | 11/1999 |
|---|---|---|
| KR | 10-2001-0090758 A | 10/2001 |
| KR | 10-2015-0014713 A | 2/2015 |

*Primary Examiner* — Michael P McFadden
(74) *Attorney, Agent, or Firm* — Lee & Morse P.C.

(57) ABSTRACT

A display device includes a display panel with a first area having pixels on a first surface of a substrate, a second area having pads on the first surface of the substrate, and a third area part of the second area and having the second surface of the substrate bent toward the first surface, and a flexible PCB with a first bent portion in the second area and contacting and electrically connected to the pads, the first bent portion being bent from inside of the display panel toward an external side of the display panel to wrap around an edge of the display panel, and a second bent portion extending from the first bent portion and wrapping an external side of the second area and bent toward the inside of the display panel from the external side of the display panel to contact the second surface of the substrate.

15 Claims, 23 Drawing Sheets

(51) Int. Cl.
*H01L 51/00* (2006.01)
*G02F 1/1333* (2006.01)

(56) References Cited

U.S. PATENT DOCUMENTS

2013/0257696 A1* 10/2013 Ha ..................... H01L 27/3276
                                                              345/76
2016/0143130 A1   5/2016 Wu et al.

* cited by examiner

DISPLAY DEVICE AND MANUFACTURING METHOD THEREOF

CROSS-REFERENCE TO RELATED APPLICATION

Korean Patent Application No. 10-2016-0110912, filed on Aug. 30, 2016, in the Korean Intellectual Property Office, and entitled: "Display Device and Manufacturing Method Thereof," is incorporated by reference herein in its entirety.

BACKGROUND

1. Field

The present disclosure relates to a display device and a manufacturing method thereof.

2. Description of the Related Art

As the use of various kinds of display devices, e.g., smart phones, tablet PCs, laptops, computer monitors, and TVs, has increased, demands for quality improvements of the display device have also increased. For example, in the case of display devices, there are demands for improving screen performance, e.g., screen resolution, and reducing power consumption. In another example, in the case of portable electronic devices, there are demands for reducing weight for better portability and improving visibility for fluent displaying of images on the screen when outside.

SUMMARY

An exemplary embodiment provides a display device including a display panel including a first area including a plurality of pixels on a first surface provided on a first side of a substrate, a second area including a plurality of pads on the first surface provided on a second side of the substrate, and a third area in which part of the second area is bent toward the first side from the second side; and a flexible printed circuit board (PCB) including a first bent portion provided in the second area, contacting the pads to be electrically connected thereto, and being bent toward an external side of the display panel from an inside of the display panel so as to wrap an end portion of the second side, and a second bent portion extending from the first bent portion, wrapping an external side of the second area, being bent toward the internal side of the display panel from the external side of the display panel, and being disposed on a second surface facing the first surface with the substrate therebetween.

The display panel may include a first surface on which the pixels are provided and a second surface facing the first surface, and may further include a passivation layer provided on the second surface.

The passivation layer may be provided on the second surface of the display panel so as to correspond to the first area.

The passivation layer may be provided on the second surface of the substrate so as to correspond to part of the first area and the second area.

The display panel may include a first surface on which the pixels are provided, a second surface facing the first surface, and a lateral surface for connecting the first surface and the second surface, and may further include an adhesive portion provided on the lateral surface corresponding to the third area.

The adhesive portion may include at least one of an epoxy resin, an acryl-based resin, a silicon-based resin, and a urethane-based resin.

The display device may further include a window provided on the display panel so as to protect the display panel.

The window may include a recess for receiving part of the second area, the third area, the first bent portion, and the second bent portion.

The display device may further include a driving chip electrically connected to the pads.

The driving chip may be provided on the flexible printed circuit board (PCB).

The driving chip may be provided in the second area.

The second area may include a plurality of insulating layers extending from the first area, and a receiving groove provided on the insulating layer and receiving the driving chip.

The first bent portion and the second bent portion of the flexible PCB may be continuous with each other and wrap around different ends of the second area.

Each of the first bent portion and the second bent portion may include a curved portion wrapped around a respective end of the second area, and an open portion opposite a respective curved portion, the open portions of the first bent portion and the second bent portion facing each other.

The first bent portion and the second bent portion may at least partially overlap each other.

Another embodiment provides a method for manufacturing a display device, including providing a display panel including a first area generated on a first surface provided on a first side of a substrate and including a plurality of pixels, and a second area generated on a second side of the substrate, including a plurality of pads, and to which a flexible printed circuit board (PCB) electrically connected to the pads is attached, generating a third area by bending part of the second area toward an internal side of the display panel; generating a first bent portion wrapping an external side of the second area by bending the flexible printed circuit board (PCB) toward an external side of the display panel; and generating a second bent portion by bending the flexible printed circuit board (PCB) extending from the first bent portion toward the second surface facing the first surface with the substrate therebetween.

The method may further include, before the generating of a third area, generating a passivation layer on the second surface.

The method may further include, before the generating of a third area, installing a driving chip on the flexible printed circuit board (PCB).

The method may further include, before the generating of a third area, installing a driving chip on the display panel.

The method may further include installing a window on the upper portion of the display panel.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
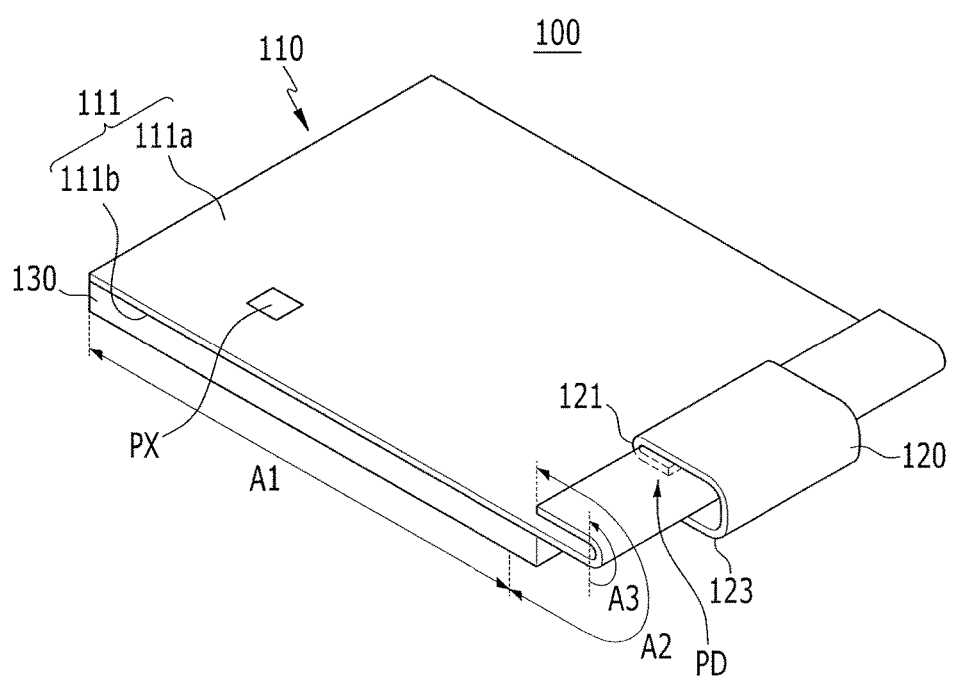
FIG. 1 illustrates a display device according to a first exemplary embodiment.

Exemplary embodiments of the present disclosure will be described in detail with reference to the accompanying drawings. In describing the present disclosure, a description of known functions or configurations will be omitted so as to make the subject matter of the present disclosure more clear.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 shows a display device 100 according to a first exemplary embodiment of the present disclosure. FIG. 2 to FIG. 5 show stages in a method for manufacturing a display device 100 including an area in which the display device 100 is bent.

As shown in FIG. 1 to FIG. 5, the display device 100 may include a display panel 110 and a flexible printed circuit board (PCB) 120.

The display panel 110 may include a first area A1, a second area A2, and a third area A3. The first through third areas A1 through A3 may be distinguished in a physical manner, but embodiments are not limited thereto, e.g., the first through third areas A1 through A3 may be virtually distinguished at points where they are connected to each other.

The first area A1 includes a plurality of pixels PX on a first side 111*a*, i.e., first surface, of a substrate 111 and displays an image. The second area A2 includes a plurality of pads PD provided on the first surface of the substrate 111 (refer to FIGS. 21 to 27). The pads of the second area A2 are electrically connected to the pixels provided in the first area A1, and transmit power voltage and electrical signals for driving the pixels and displaying images in the first area A1.

Even though the first area A1 includes a plurality of pixels and the second area A2 includes a plurality of pads, the first area A1 is not necessarily limited to a display area and the second area A2 is not necessarily limited a pad area. For example, the pad area may be included in part of the first area A1 or a plurality of pixels may be included in part of the second area A2. For example, the second areas A2 may be peripheral with respect to the first area A1.

The third area A3 is generated when part of the second area A2 is bent toward the first side 111*a* of the substrate 111, i.e., where the first area A1 is provided, from the second side 111*b* of the substrate 111. That is, as illustrated in FIG. 1, part of an edge of the display panel 110, e.g., a part of the display panel 110 extending beyond the first area A1, may be bent, e.g., doubled over on itself, toward the first area A1, in which the plurality of pixels are generated to become the third area A3. For example, the first through third areas A1 through A3 may be continuous and integral with each other on the same substrate 111.

FIG. 1 illustrates that the third area A3 is included in part of the second area A2. However, the present embodiment is not limited thereto, e.g., the third area A3 may be generated by bending part of the first area A1. Therefore, according to the above-described exemplary variation, a plurality of pixels may be disposed in the bent portion, i.e., in the third area A3, to display the image.

Figure 2:
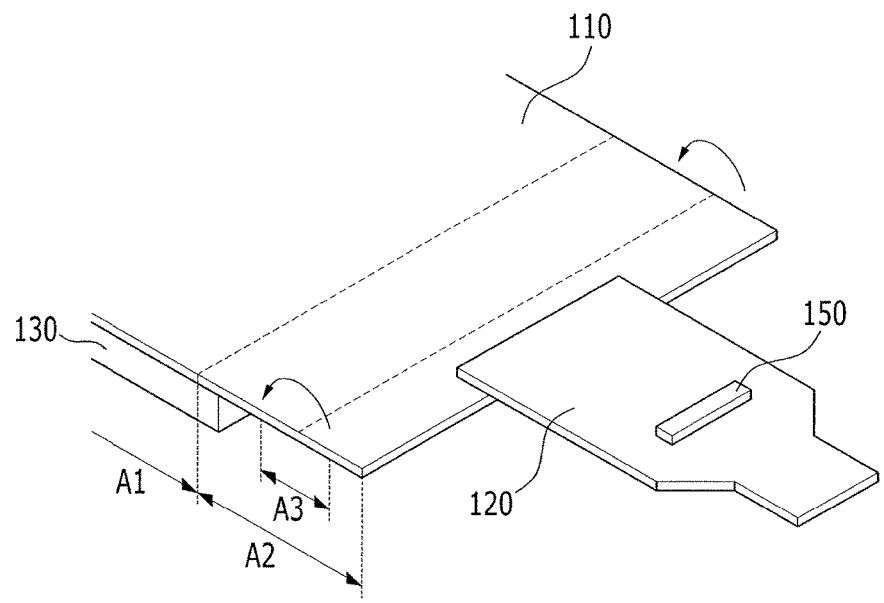
FIG. 2 to FIG. 5 illustrate stages in a bending process of the display device of FIG. 1.

FIG. 2 shows that part of the display panel 110 is bent, e.g., along the right-most dashed line in FIG. 2, so as to generate the third area A3 in part of the second area A2 of the display device 100 according to the present exemplary embodiment. As shown in FIG. 2, the third area A3 may be generated by bending part of the second area A2.

Figure 3:
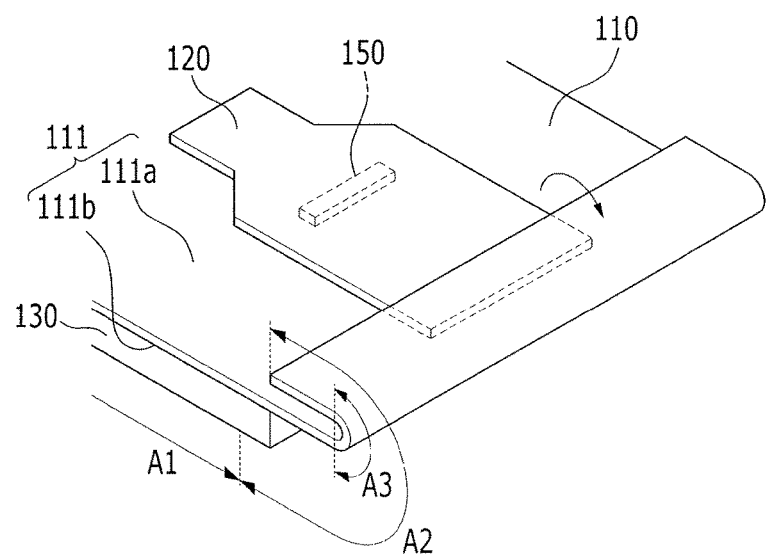

FIG. 3 shows a state after the display panel 110 of FIG. 2 is bent to generate the third area A3. As illustrated in FIG. 3, the third area A3 refers to the portion of the display panel 110 that includes the bend along the dashed line of FIG. 2. As further shown in FIG. 3, according to the present exemplary embodiment, the second area A2 is bent toward an upper side of the substrate 111, i.e., toward the first side 111*a* of the substrate 111, on which the plurality of pixels are provided.

The flexible PCB 120 is electrically connected to the plurality of pads provided on the second area A2 of the display panel 110. The flexible PCB 120 contacts the pads on the second area A2, and transmits power voltage and electrical signals for driving the first area A1 to the first area A1 from the outside. The flexible PCB 120 has flexibility so it is easily transformed. As illustrated in FIG. 3, when a portion of the display panel 110 is bent over the first side 111*a* of the substrate 111, the flexible PCB 120 extends from the bent portion of the display panel 110 to overlap the first area A1 with a driving chip 150 facing the first side 111*a* of the substrate 111, e.g., an edge of the flexible PCB 120 connected to the display panel 110 may be between two facing portions of the first side 111*a* of the substrate 111 that is in a bent state.

A passivation layer 130 may be attached to the second side 111*b* of the display panel 110 according to the present exemplary embodiment. In other words, the passivation layer 130 is attached to a lower portion of the substrate 111 of the display panel 110 to prevent foreign substances, e.g., moisture or oxygen, from permeating into the display panel 110 from the outside.

To be described hereinafter, as shown in FIG. 1 to FIG. 11 according to an exemplary embodiment, the passivation layer 130 may be attached to the first area A1 and to part of the second area A2, but is not limited thereto. For example, the passivation layer 130 may be attached to correspond, e.g., only, to the first area A1 or, e.g., only, to a part of the first area A1. In yet another example, as shown in FIG. 12, the passivation layer 130 may be attached discontinuously to a part of the second area A2, or throughout the lower portion of the display panel 110 (FIG. 13).

Figure 4:
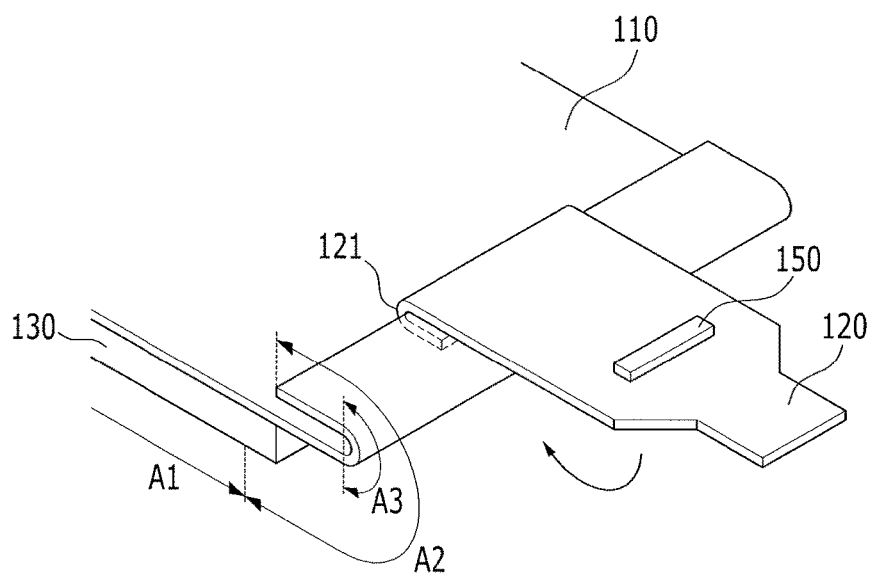

Referring to FIG. 4, a portion of the flexible PCB 120 overlapping the first area A1 (FIG. 3) may be bent over an edge of the display panel 110, i.e., about 180°, to have the driving chip 150 face away from the display panel 110. The bend of the flexible PCB 120 defines a first bent portion 121, i.e., generated when the flexible PCB 120 is bent toward the outside of the display panel 110 from the inside of the display panel 110 on which the second area A2 of the display panel 110 is provided. FIG. 4 shows that the first bent portion 121 is generated by bending the flexible PCB 120 once on the display panel 110 on which the third area A3 is generated.

In detail, as shown in FIG. 3, the flexible PCB 120 is provided on, e.g., over, an upper portion of the first area A1 by the third area A3 of the display panel 110 bent toward the inside of the display panel 110 from the outside of the display panel 110. As illustrated in FIG. 4, when the flexible PCB 120 is bent to move toward the outside of the display panel 110 in an opposite direction, i.e., away from the first area A1, and wrap an external side of the second area A2, e.g., an external edge of the display panel 110, that is an exposed portion of the second area A2, it becomes the first bent portion 121.

Figure 5:
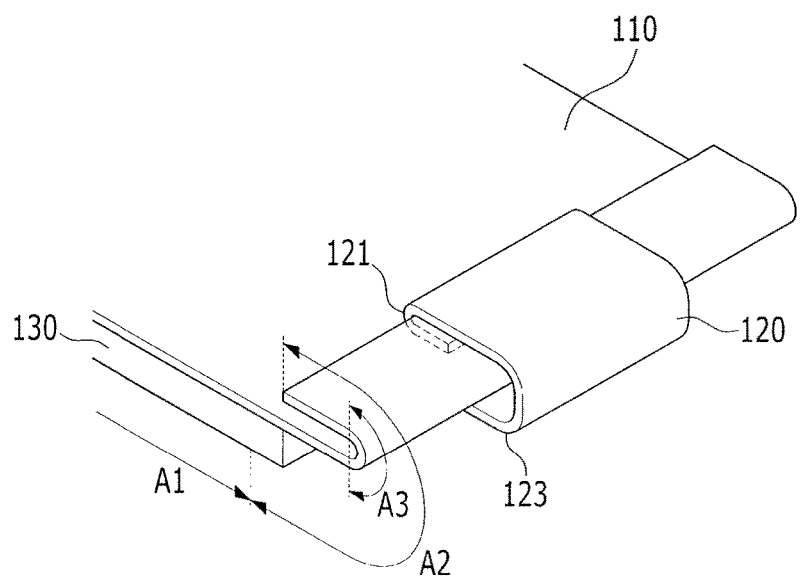

Referring to FIG. 5, a second bent portion 123 is generated by bending the flexible PCB 120 to extend toward the second side 111b of the substrate 111, i.e., toward the inside of the display panel 110 from the outside of the display panel 110 by the first bent portion 121. That is, as illustrated in FIG. 5, the second bent portion 123 is generated on the flexible PCB 120 on which the first bent portion 121 is generated.

In detail, as shown in FIG. 4, an end portion of the flexible PCB 120, on which the first bent portion 121 is generated, may wrap the external side of the second area A2 and may be bent toward the first area A1. That is, the flexible PCB 120 extending to the outside of the display panel 110 (FIG. 4) is bent toward the second side 111b of the substrate 111, i.e., around the bent third area A3, to become the second bent portion 123 (FIG. 5). Accordingly, the second bent portion 123 is bent and disposed on the second side 111b opposite the first side 111a of the display panel 110, so it may not hinder a path of light generated from the first area A1.

FIG. 5 illustrates an enlarged part of the third area A3 of the display panel 110 with the first bent portion 121 and the second bent portion 123 of the flexible PCB 120. As shown in FIG. 5, the display device 100 according to the present exemplary embodiment includes the third area A3, which is a bent part of the display panel 110, and the first bent portion 121 and the second bent portion 123 generated by bending the flexible PCB 120 twice. Therefore, a width of a non-display area, which excludes the first area A1 displaying images, may be reduced, e.g., to allow for an enlarged first area A1, while the flexible PCB 120 may be properly connected while bending along different surfaces of the bend portion, i.e., second area A2, of the display panel 110.

Figure 6:
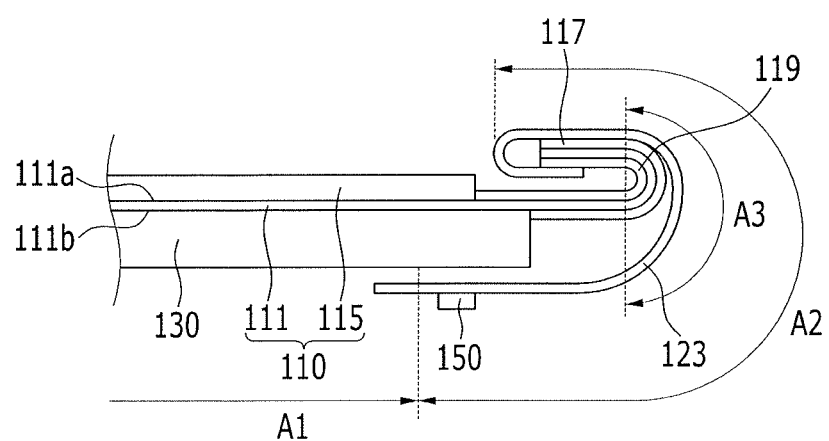
FIG. 6 illustrates a view of one enlarged side of FIG. 5.

FIG. 6 shows an enlarged, detailed side view of the display device 100 shown in FIG. 5. As shown in FIG. 6, the display panel 110 includes the substrate 111 and an insulating layer 115 on the first side 111a of the substrate 111, and the flexible PCB 120 connected to the second side 111b of the substrate 111. That is, the insulating layer 115 and the passivation layer 130 are on opposite sides of the substrate 111, and an edge of the flexible PCB 120 including the driving chip 150 extends to overlap at least a portion of the second side 111b of the substrate 111 in the first area A1, with the driving chip 150 being in the second area A2 and facing away from the second side 111b of the substrate 111.

As further illustrated in FIG. 6, the display panel 110 according to the present exemplary embodiment includes an external stress control layer 117 and an internal stress control layer 119, so as to disperse the stress provided by the bending in the third area A3 and preventing damage of the display panel 110. The external stress control layer 117 may be disposed outside the third area A3 to control a tensile stress, and the internal stress control layer 119 may be disposed inside the third area A3 to control the compressive stress.

For example, as illustrated in FIG. 6, the external stress control layer 117 may be on an outer surface of the substrate 111 that defines the third area A3, e.g., on the second side 111b of the substrate 111 that bends upward toward the first side 111a, and may extend, e.g., continuously, from an outermost edge of the substrate 111 to an edge of the passivation layer 130. For example, as illustrated in FIG. 6, the internal stress control layer 119 may be disposed on an inner surface of the substrate 111 that defines the third area A3, e.g., on the first side 111a, and may extend, e.g., continuously, from an outermost edge of the substrate 111 to an edge of the insulating layer 115. For example, the external stress control layer 117 and the internal stress control layer 119 may be on opposite surfaces of the substrate 111 in the third area A3 and in part of the second area A2.

It is noted that while FIG. 6 shows the external stress control layer 117 and the internal stress control layer 119, exemplary embodiments are not limited thereto, e.g., only one of external stress control layer 117 and the internal stress control layer 119 may be included. The external stress control layer 117 and the internal stress control layer 119 may be a polymer resin including at least one of, e.g., an acryl, a polyimide (PI), or a polyurethane (PU), and are generated by coating or injecting a liquefied paste.

Figure 7:
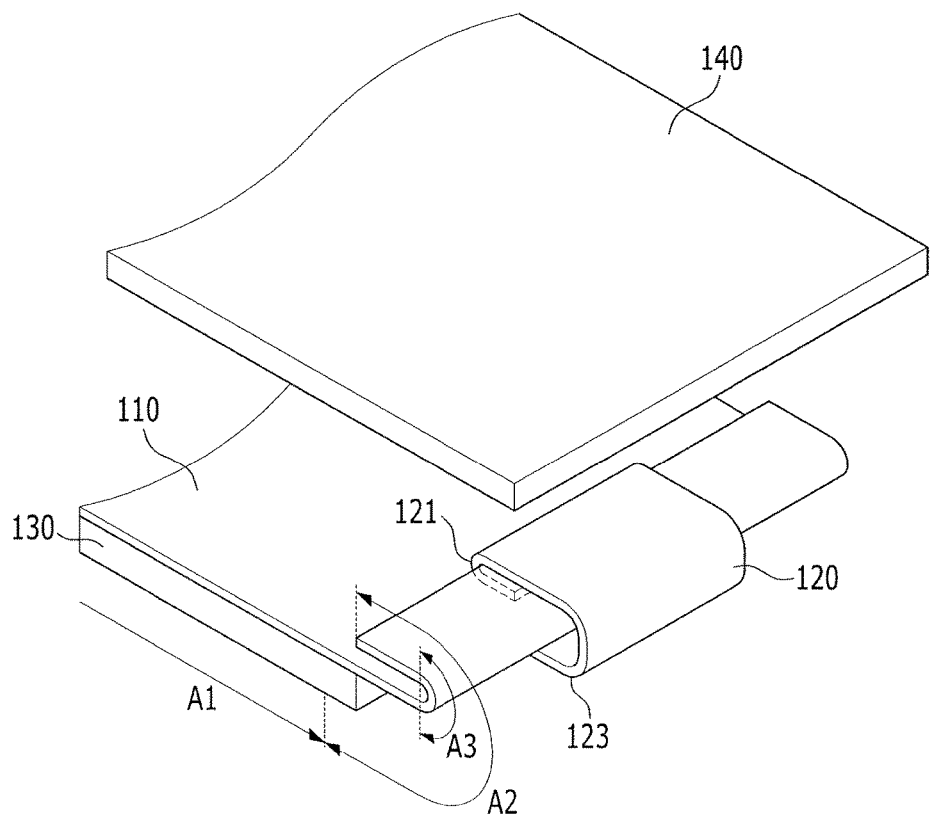
FIG. 7 illustrates a window installed in the display device of FIG. 1.
Figure 8:
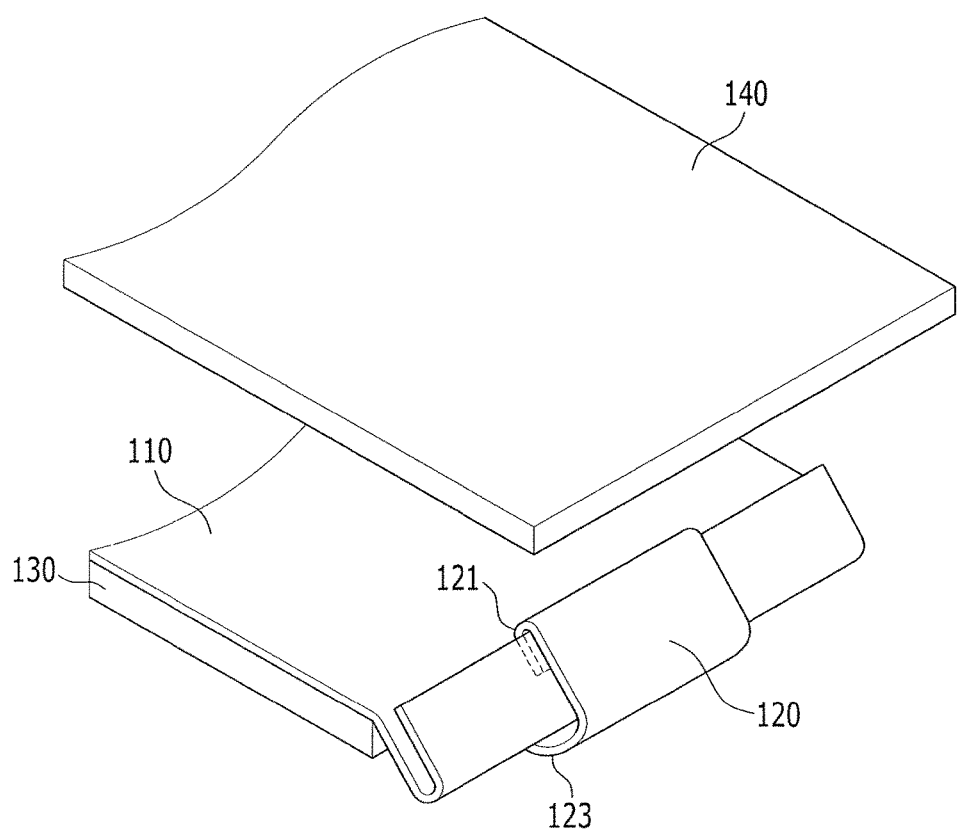
FIG. 8 illustrates a third area of the display device of FIG. 7 that is bent.

FIG. 7 shows a window 140 installed in the display device 100. FIG. 8 shows the display device 100 with the bent third area A3 when the window 140 is installed.

As shown in FIG. 7 and FIG. 8, the window 140 is provided on a first side of the display panel 110, i.e., corresponding to the first side 111a of the substrate 111 in FIG. 1, to protect the display panel 110 from being damaged by external impacts and contaminated by foreign particles. The window 140 may be made of a material such as glass or a transparent polymer resin, e.g., polyethyleneterephthalate (PET) and poly(methylmethacrylate) (PMMA).

As shown in FIG. 7, when the window 140 is installed on the display panel 110, the first area A1 of the display panel 110 is attached to the window 140, e.g., the window may be attached directly to the first area A1 on display panel 110. As a height of the third area A3 with the flexible PCB 120 is higher than that of the first area A1, the third area A3, the flexible PCB 120, and at least a part of the second area A2 may be moved to facilitated attachment of the window 140 to the first area A1. That is, as shown in FIG. 8, the third area A3 of the display panel 110, along with the flexible printed circuit board (PCB) 120, is bent downward toward the second side of the display panel 110 to facilitate attachment of the window 140 to the first area A1. The flexible PCB 120 may be fixed to the lower portion of the display panel 110.

Figure 9:
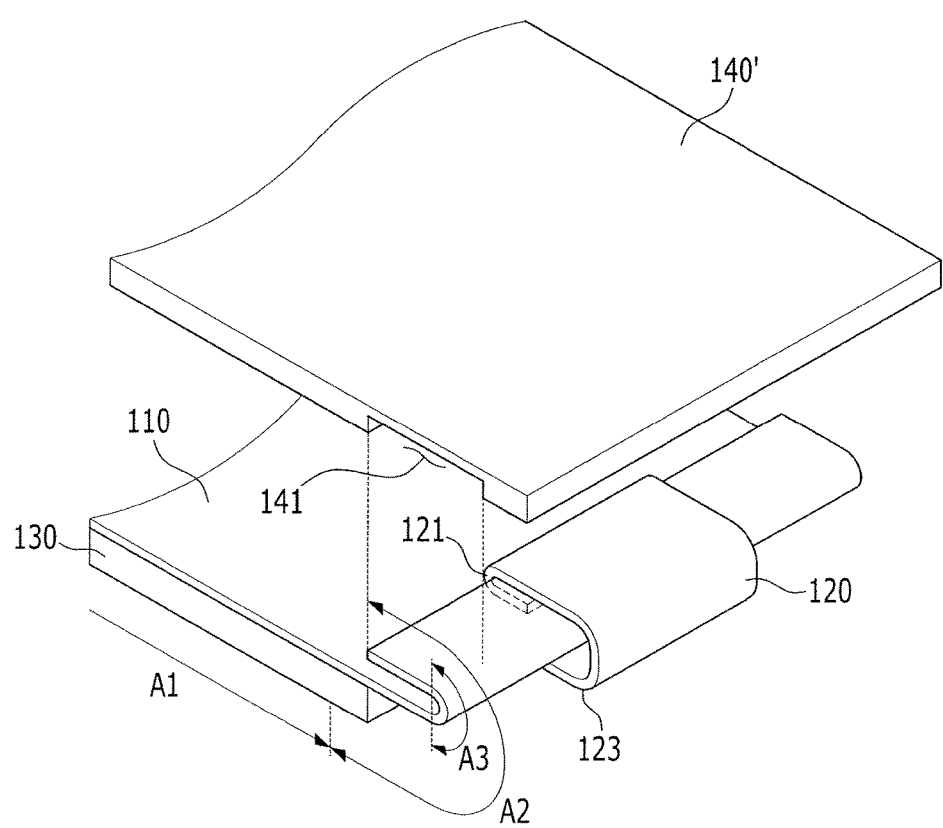
FIG. 9 illustrates an exemplary variation of a window in the display device in FIG. 7.
Figure 10:
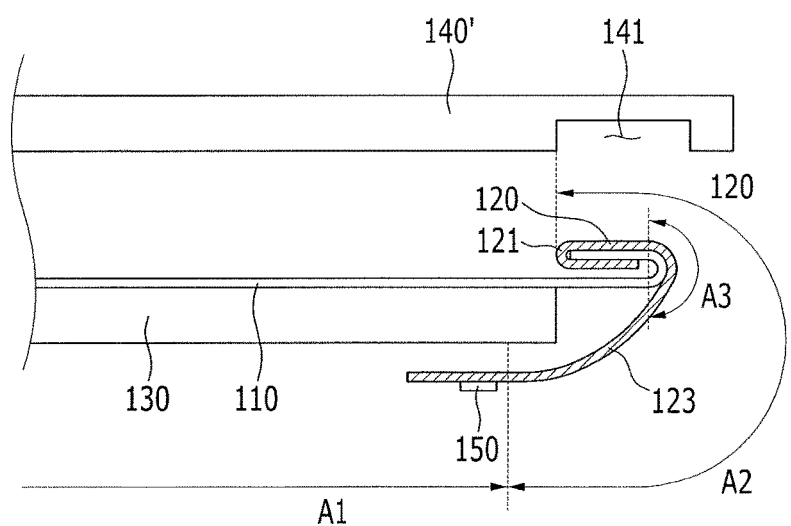
FIG. 10 illustrates a cross-sectional view of a display device shown in FIG. 9.

FIG. 9 and FIG. 10 show an exemplary variation of a window of a display device according to embodiments. FIG.

9 shows a display device having a window 140' with a recess 141 at a position corresponding to the third area A3, and FIG. 10 shows a lateral cross-sectional view of the display device in FIG. 9. No detailed description of the previously described configuration will be provided.

As shown in FIG. 9 and FIG. 10, the window 140' according to the present exemplary embodiment includes the recess 141 on part of the power portion of the window 140' attached to the display panel 110. The recess 141 may extend to a predetermined depth into the window 140', and may have a substantially same length as the third area A3, e.g., the third area A3 and the recess 141 may completely overlap each other. The recess 141 may receive part of the second area A2 and the third area A3 and part of the first bent portion 121 and the second bent portion 123 of the flexible PCB 120. That is, when the window 140' is attached to the display panel 110, the bent portion of the display panel 110 with the flexible PCB 120 may fit in the recess 141 of the window 140', e.g., so there is no need to further bend the third area A3 with the flexible PCB 120 away from the window 140'.

An adhesive portion for fixation may be included so that the third area A3 of the display panel 110 and the first bent portion 121 and the second bent portion 123 of the flexible PCB 120 received in the recess 141 do not move or leave the recess 141. In order for part of the display panel 110 and part of the flexible PCB 120 to be easily received in the recess 141, the recess 141 may be generated to be wider than the part of the display panel 110 and the part of the flexible PCB 120 inserted therein. Further, as shown in FIG. 9 and FIG. 10, the recess 141 may extend to be open to the side of the window 140' and have a bar shape.

Figure 11:
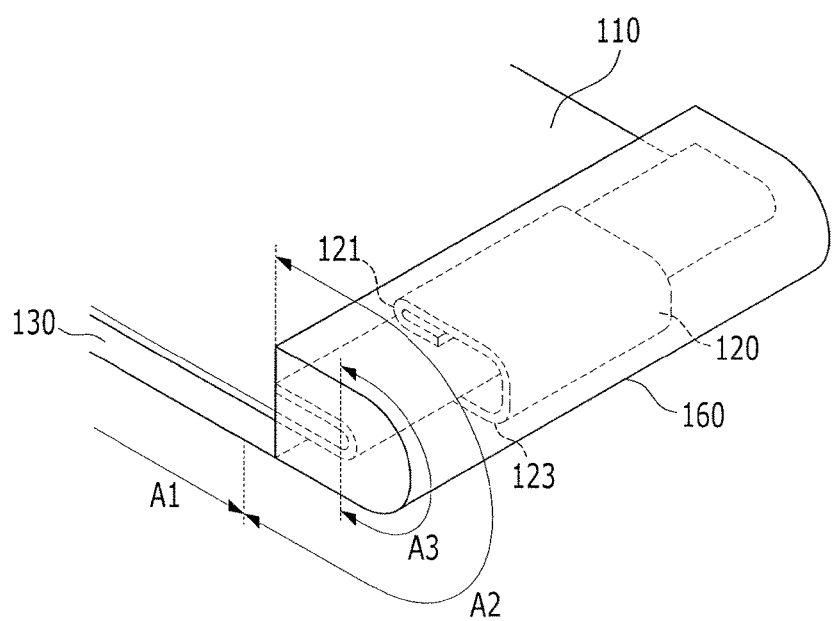
FIG. 11 to FIG. 13 illustrate a display device further including a capping layer according to an exemplary variation of the present disclosure.
Figure 12:
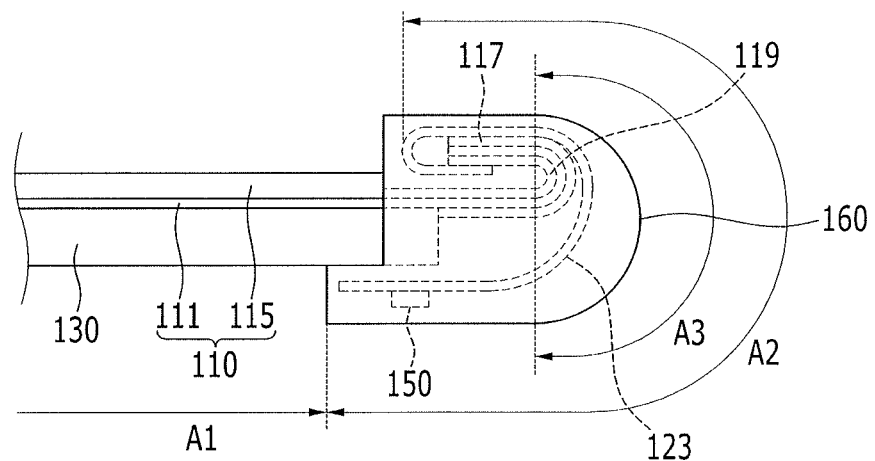
Figure 13:
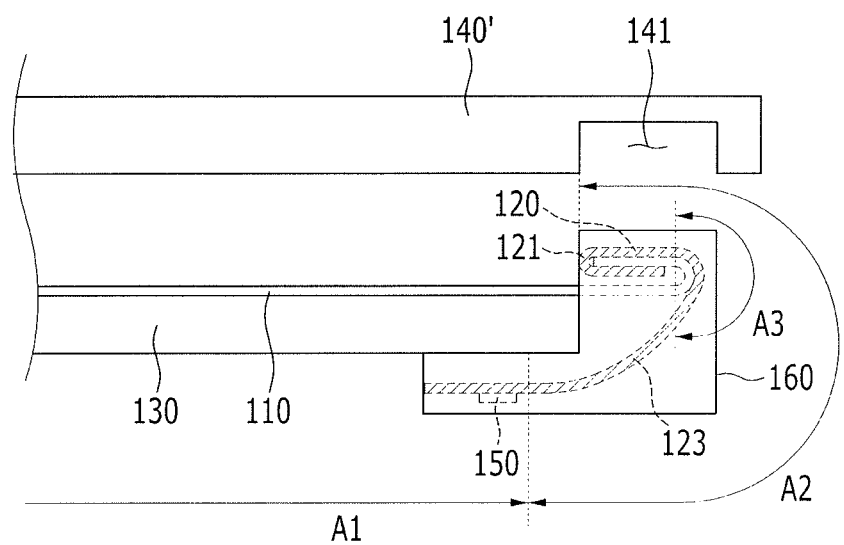

FIG. 11 to FIG. 13 show a display device according to example embodiments further including a capping layer 160. As shown in FIG. 11 to FIG. 13, the display device includes the capping layer 160 for covering the second area A2.

The capping layer 160 according to the present exemplary embodiment may cover part of or the whole second area A2 to protect at least part of the end portion of the bent display panel 110, the flexible PCB 120, and the driving chip 150. The capping layer 160 may be made of a synthetic resin used for manufacturing the display device, e.g., polyethylene terephthalate (PET) or poly(methyl methacrylate) (PMMA). Without being limited to this, a material for covering part of or the total second area A2 to fix the components included therein and protect the same may be used as a material of the capping layer 160 according to the present exemplary embodiment.

FIG. 11 shows the capping layer 160 with a border overlapping that of the passivation layer 130. The capping layer 160 covers part of the second area A2. In order for the passivation layer 130 to overlap the border of the capping layer 160 as shown in FIG. 11, the driving chip 150 may be provided at the lower portion of the display panel 110 provided in the second area A2. In another way, the driving chip 150 may be provided at the lower portion of the passivation layer 130, as shown in FIG. 10, and it may cover part of the flexible PCB 120 and part of the display panel 110 corresponding to the third area A3 except the driving chip 150.

FIG. 12 shows the capping layer 160 including the second area A2 and having a border overlapping that of the insulating layer 115 of the display panel 110. The capping layer 160 of FIG. 12 may extend to the lower portion of the passivation layer 130, and is generated to cover the driving chip 150 disposed to the lower portion of the passivation layer 130. In this instance, the capping layer 160 according to the present embodiment may cover part of the side of the passivation layer 130.

FIG. 13 shows the capping layer 160 in a display device including the window 140' of FIG. 10. As shown in FIG. 13, the window 140' includes the recess 141, and the capping layer 160 is generated to correspond to the inside of the recess 141 so as to be inserted in the recess 141 and fixed thereto. The inside of the recess 141 may have a quadrangular column shape of which a side is open, and the capping layer 160 may also be generated to have a quadrangular column shape. The capping layer 160 shown in FIG. 13 extends to the lower portion of the passivation layer 130 to cover the driving chip 150 disposed on the lower portion of the passivation layer 130. Without being limited to this, the capping layer 160 may be generated to contact the border of the passivation layer 130, and the driving chip 150 may be provided in the capping layer 160, as shown in FIG. 11.

Figure 14:
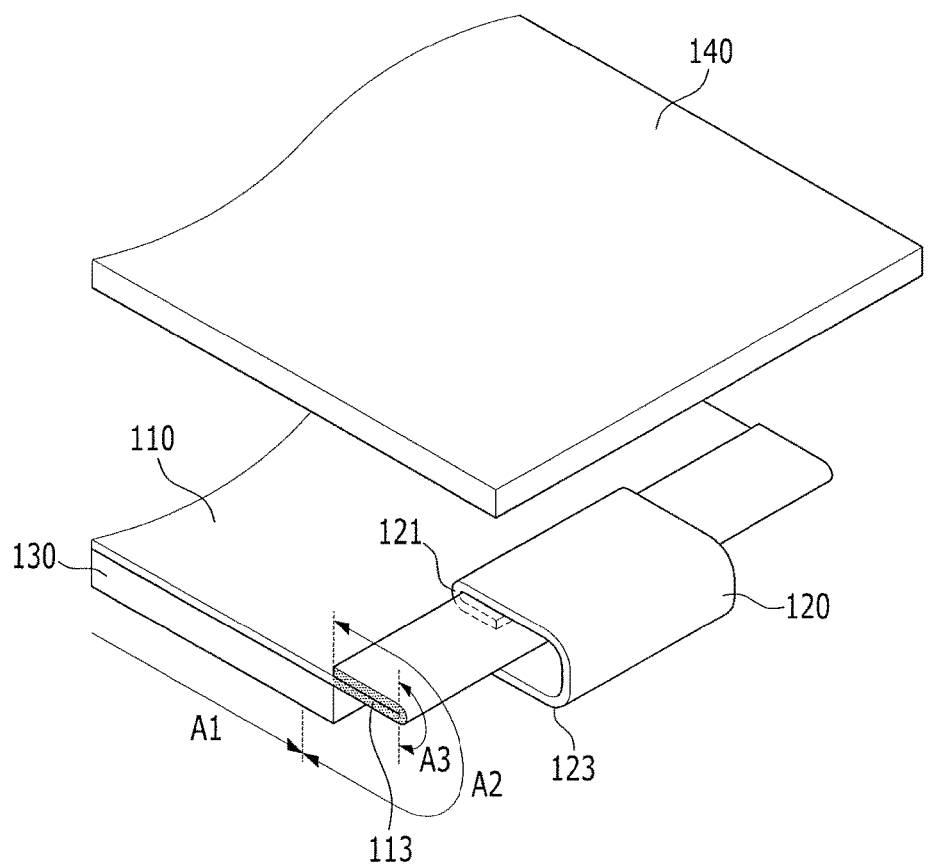
FIG. 14 illustrates the display device in FIG. 7 with an adhesive portion.

FIG. 14 shows a display device further including an adhesive portion 113 for fixing the third area A3 of the display panel.

The display panel 110 is generated to have a plate shape including a first side, on which a plurality of pixels are provided, and a second side facing the first side. In this instance, the first side and the second side are connected by a lateral side.

As shown in FIG. 14, when the display panel 110 has a quadrangular plate shape, four lateral sides may be generated. In this instance, the adhesive portion 113 is provided on part of the lateral side of the third area A3 of the display panel 110, thereby fixing the bent state of the third area A3 of the display panel 110.

The adhesive portion 113 may be generated by applying an adhesive resin to the lateral side of the display panel 110 corresponding to the third area A3 and curing the same. The adhesive portion 113 may include at least one of, e.g., an epoxy resin, an acryl-based resin, a silicon-based resin, and a urethane-based resin. However, the adhesive portion 113 is not limited thereto. e.g., it may be an adhesive film.

The display device 100 may further include the passivation layer 130 so as to prevent contamination by foreign particles provided to the display panel 110 from the lower portion of the display panel 110 and protect the display panel 110 from external impacts. The passivation layer 130 may be made of a transparent and flexible material, e.g., polyethylene terephthalate (PET).

FIG. 7 shows that the passivation layer 130 according to the present exemplary embodiment is attached to the second side of the display panel 110 corresponding to the first area A1. Without being limited to this, the passivation layer 130 may be attached to the lower portion of the display panel 110 corresponding to part of the first area A1 and to the second area A2, or the passivation layer 130 may be attached to the entire lower portion of the display panel 110 according to exemplary variations.

Figure 15:
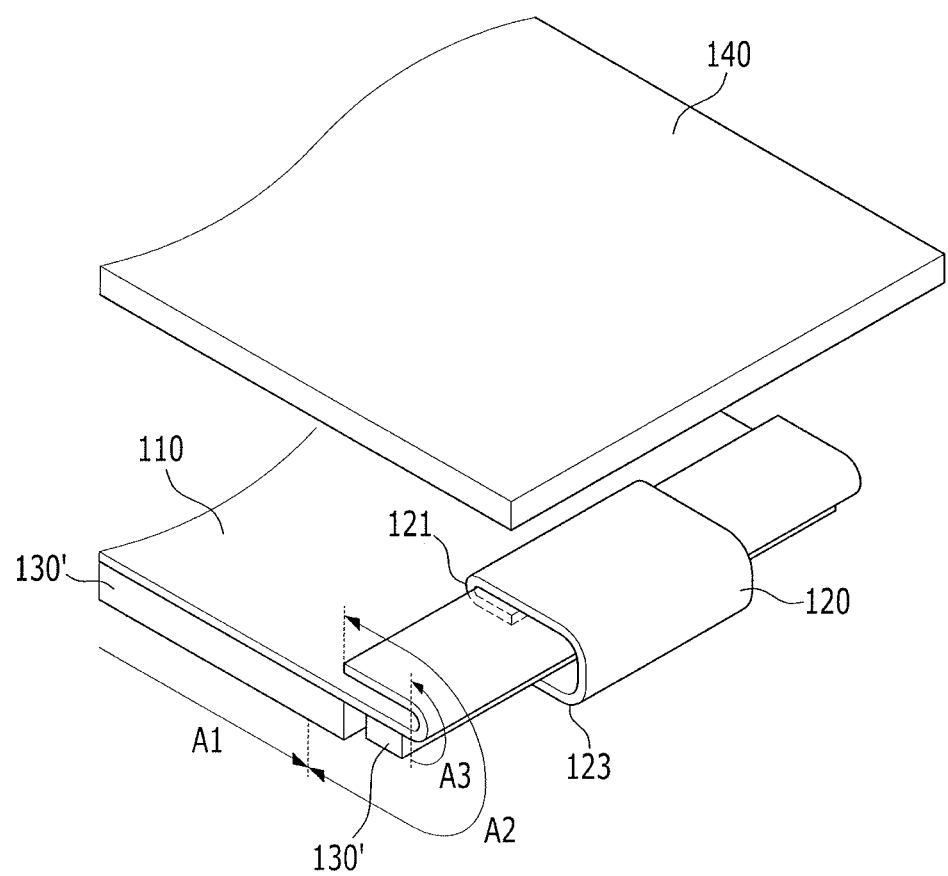
FIG. 15 illustrates a first exemplary variation of the display device in FIG. 7.
Figure 16:
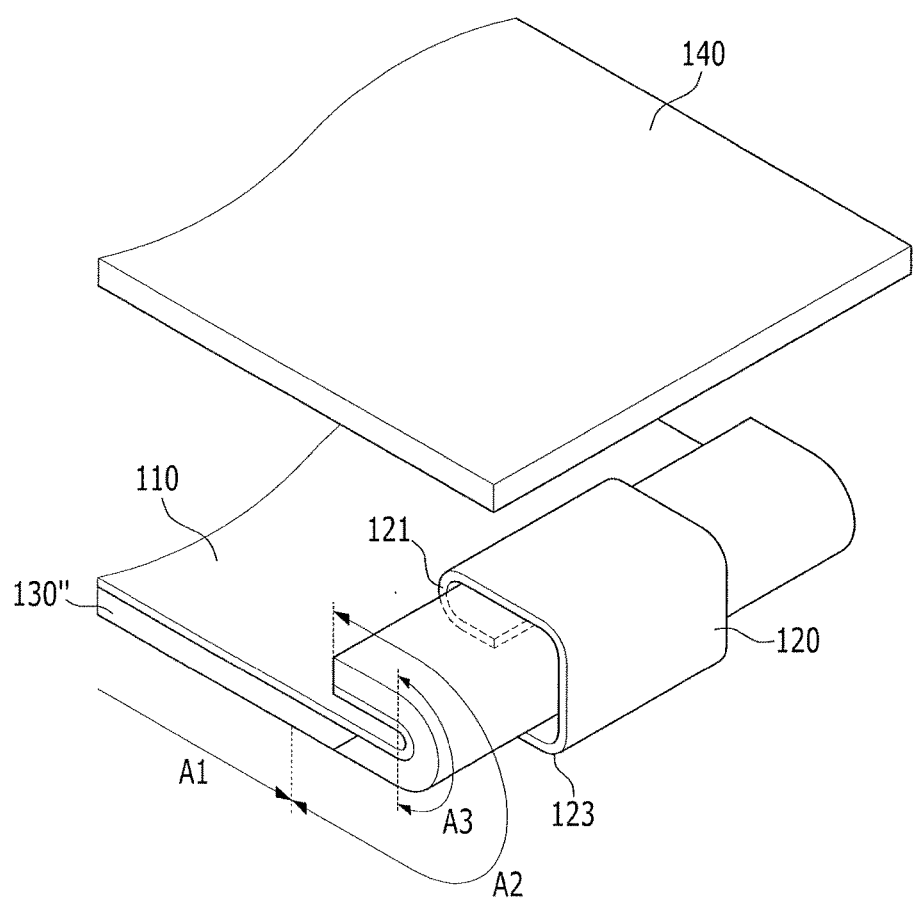
FIG. 16 illustrates a second exemplary variation of the display device in FIG. 7.

FIG. 15 and FIG. 16 show exemplary variations of display devices with a changed position at which the passivation layer is attached. When numerous exemplary variations are described, detailed descriptions of the same configuration will not be provided. As shown in FIG. 15 and FIG. 16, the passivation layer may be attached to the lower portion of the display panel 110 with various shapes, and it may include the second area A2 of the display panel 110 irrespective of the attached shape of the passivation layer.

Referring to FIG. 15, a passivation layer 130' is attached to the lower portion of the display panel 110 corresponding to part of the first area A1 and to the second area A2. As illustrated in FIG. 15, the passivation layer 130' may include two discontinuous portions on the first and second areas A1 and A2, respectively.

Referring to FIG. 16, a passivation layer 130" is attached to the entire lower portion of the display panel 110. As illustrated in FIG. 16, the passivation layer 130" continuously extend along the entire second side 111b of the substrate 111.

The display device according to exemplary embodiments described with reference to FIG. 1 to FIG. 16 includes the driving chip 150 on the flexible PCB 120. That is, the display device 100 according to the present exemplary embodiment is generated as a chip on film (COF) type. The driving chip 150 of the present exemplary embodiment may include a driving circuit for driving a plurality of pixels of the display panel 110.

FIG. 17 to FIG. 20 show stages in a method for manufacturing a display device including the third area A3 generated by bending the display device 100 with the driving chip 150 installed on the display panel 110 according to an exemplary embodiment. The driving chip 150 may be provided in the second area A2 of the display panel 110. The driving chip 150 may be a chip on plastic (COP) type.

Figure 17:
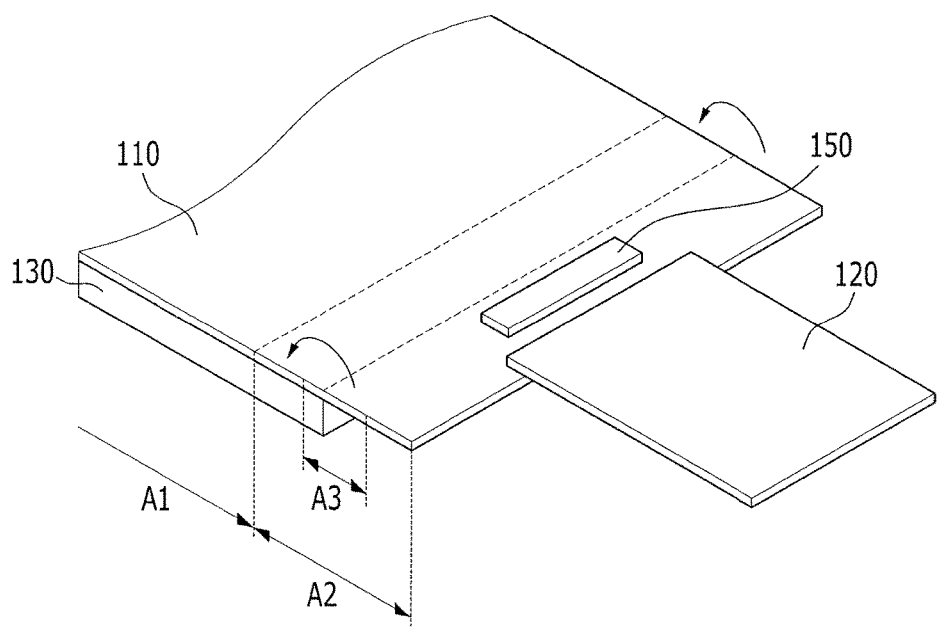
FIG. 17 to FIG. 20 illustrate stages in a bending process of a display device according to an exemplary embodiment.
Figure 18:
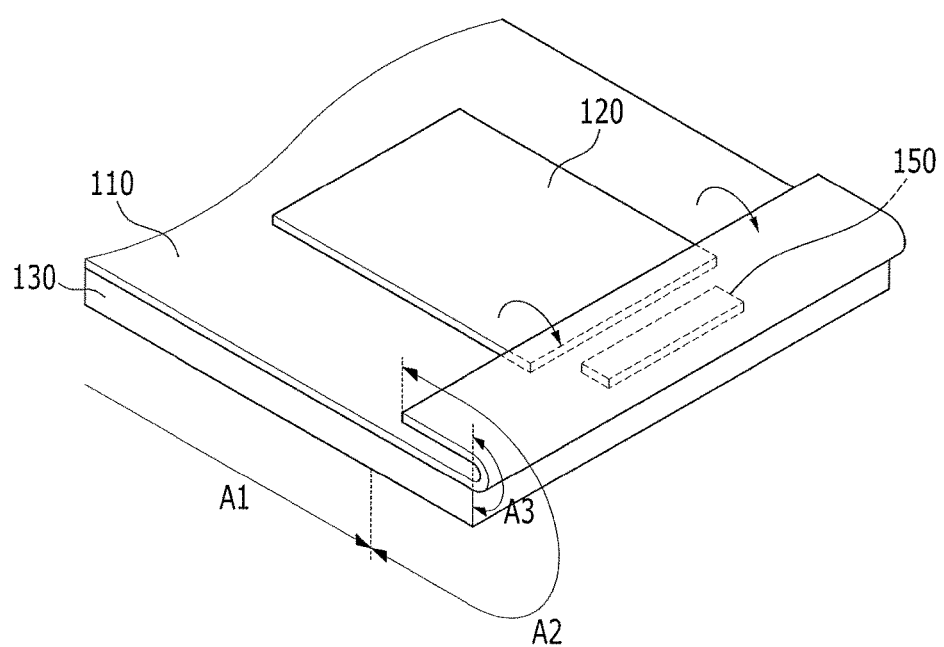
Figure 19:
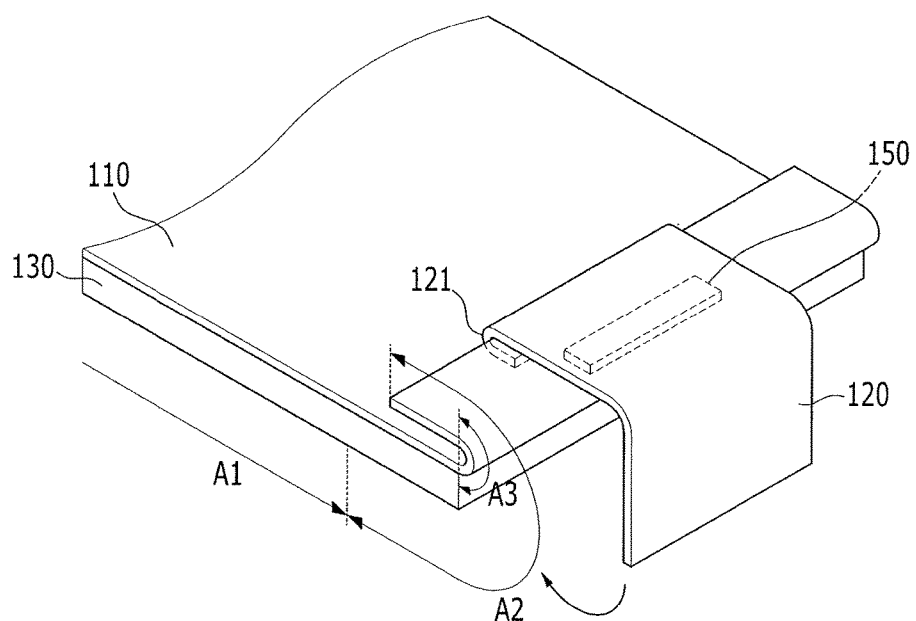
Figure 20:
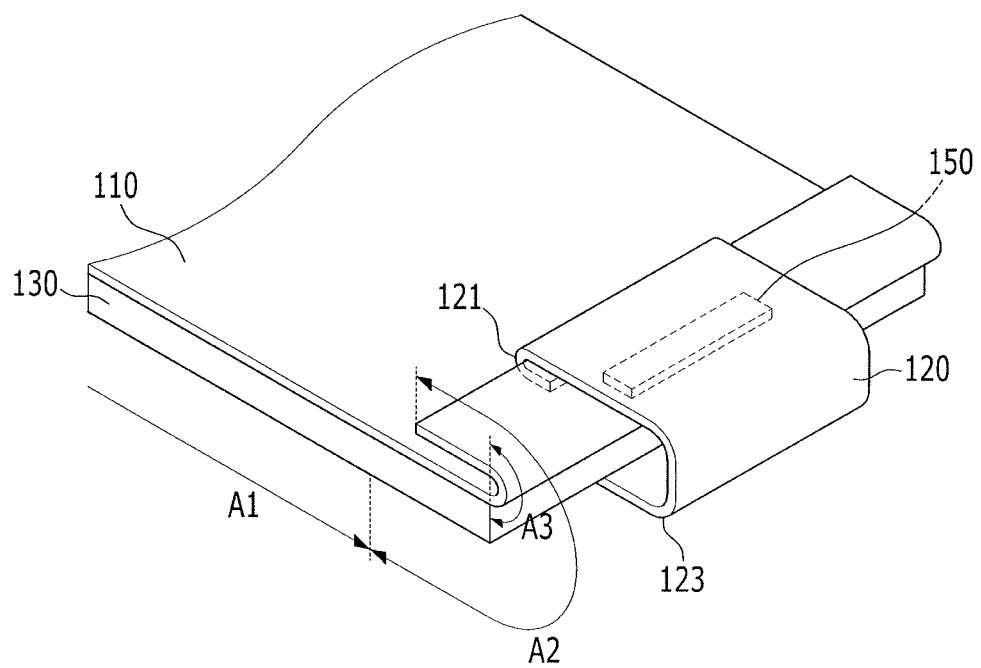

As shown in FIG. 17, when the driving chip 150 is installed on the display panel 110, the second area A2 in which the driving chip 150 is installed is bent toward the first area A1 of the display panel 110 to generate the third area A3. In this instance, the flexible PCB 120 connected to the second area A2 of the display panel 110 may also move to be provided in the first area A1, as shown in FIG. 18. When the third area A3 is generated on part of the display panel 110, as shown in FIG. 18, the flexible PCB 120 provided in the first area A1 is bent toward the outside of the display panel 110 to generate the first bent portion 121, as shown in FIG. 19. The flexible PCB 120 extending toward the outside of the display panel 110 is bent toward the lower portion of the display panel 110, i.e., the side to which the passivation layer 130 is attached, to generate the second bent portion 123, which is shown in FIG. 20.

Figure 21:
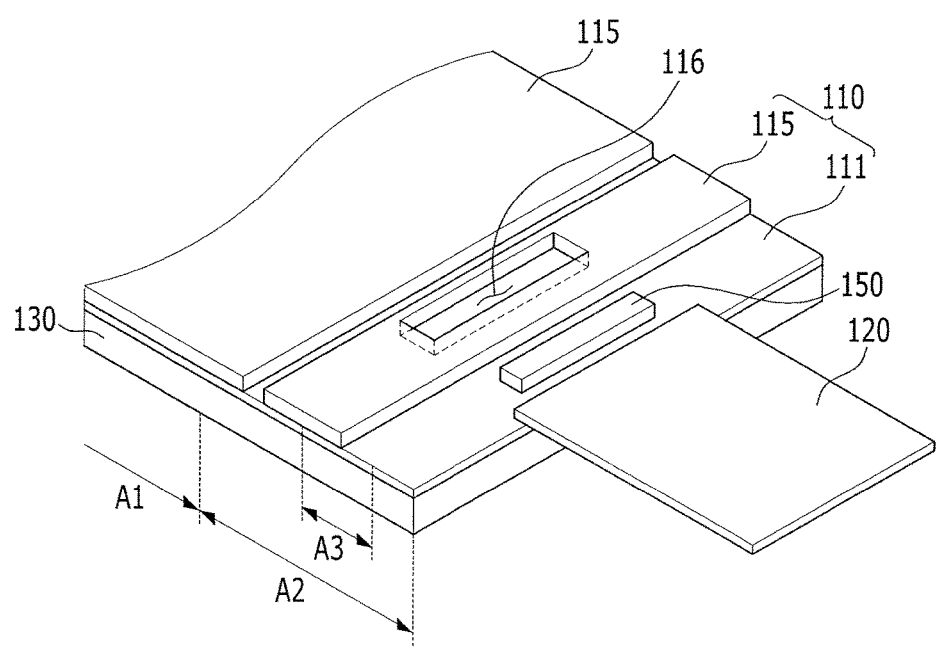
FIG. 21 to FIG. 23 illustrate stages in a bending process of a display device according to a first exemplary variation of an exemplary embodiment.
Figure 22:
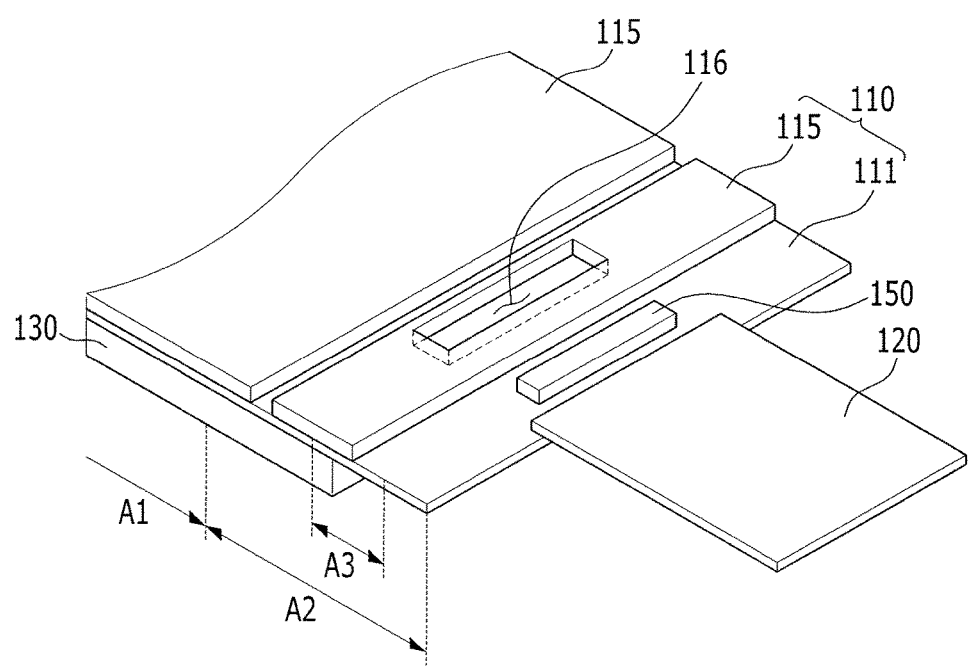
Figure 23:
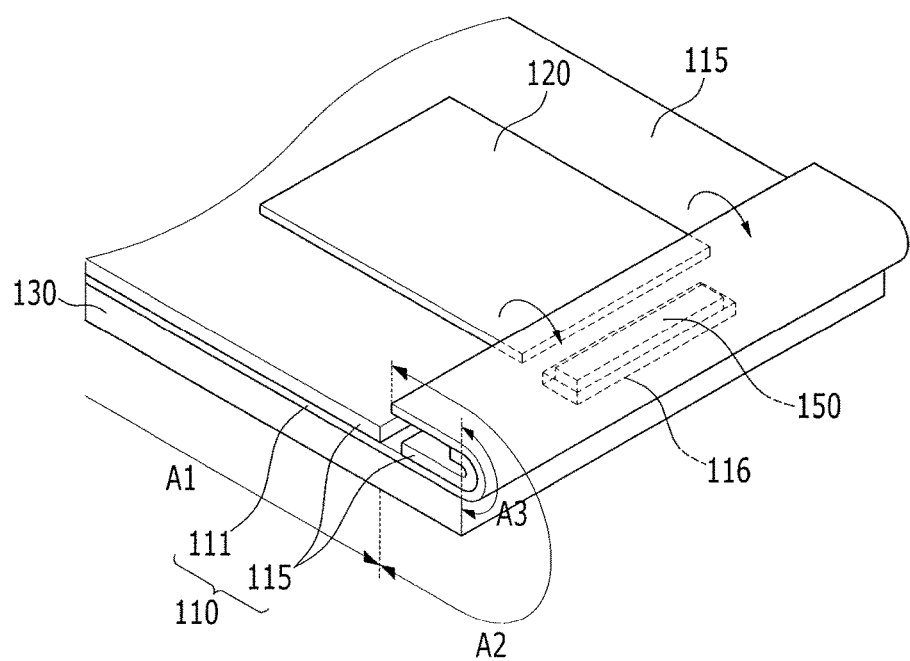

FIG. 21 to FIG. 23 show an exemplary variation of the display device according to an exemplary embodiment, showing a bending process of a display device in which a receiving groove 116 is generated in the display panel 110. Detailed descriptions of previously described configurations will not be provided.

As shown in FIG. 21, the display device according to the present exemplary embodiment includes the receiving groove 116 generated by opening part of the second area A2 of the display panel 110. In detail, the receiving groove 116 is a groove formed through the insulating layer 115, i.e., part of the insulating layer 115 in the second area A2 is opened. e.g., removed, to define a recessed cavity.

The first area A1 includes a plurality of pixels, and further includes conductors including a transistor for driving the plurality of pixels, an electrode for applying voltage to each pixel, and the insulating layer 115 for electrical insulation among the conductors. The insulating layer 115 stacked with a plurality of layers extends to the second area A2, as well as the first area A1, in order to protect various components provided in respective areas. The insulating layer 115 includes insulating layers, e.g., a buffer layer, a barrier layer, and a gate insulating layer generated on the substrate 111 in addition to an insulating layer, e.g., an interlayer insulating layer, and when all or some of them are opened, the receiving groove 116 is generated.

Referring to FIG. 22, a part of the passivation layer 130 may be removed from the substrate 111, i.e., a part corresponding to the second area A2 from among the passivation layer 130 provided on the lower side of the substrate 111, for smooth bending of the third area A3. As shown in FIG. 21, when the passivation layer 130 is provided on the lower portion of the substrate 111, the driving chip 150 may be installed in the second area A2 of the display panel 110 on the upper portion of the substrate 111. The display panel 110 is a flexible display panel so when the passivation layer 130 is provided on the second side 111b side, the driving chip 150 may be installed on the first side 111a in a stable manner.

When part of the passivation layer 130 is removed, as shown in FIG. 22, the display panel 110 may be smoothly bent, as shown in FIG. 23, in the area where the passivation layer 130 has been removed from the second areas A2, to generate the third area A3. Accordingly, the display panel 110 may be prevented from being damaged.

When the third area A3 is bent, the driving chip 150 installed in the second area A2 is bent toward the first area A1, as shown in FIG. 23. Therefore, the driving chip 150 may be bent to be inserted into the receiving groove 116 on the upper side of the display panel 110, thereby acquiring a stable combination. In this instance, an adhesive portion may be further included so as to fix the components installed in the receiving groove 116 to the receiving groove 116.

When the third area A3 is bent so as to receive the driving chip 150 in the receiving groove 116, the flexible PCB 120 is bent twice to generate the first bent portion 121 and the second bent portion 123. Therefore, an amount of space required for installing the flexible PCB 120 may be minimized, as described previously.

Figure 24:
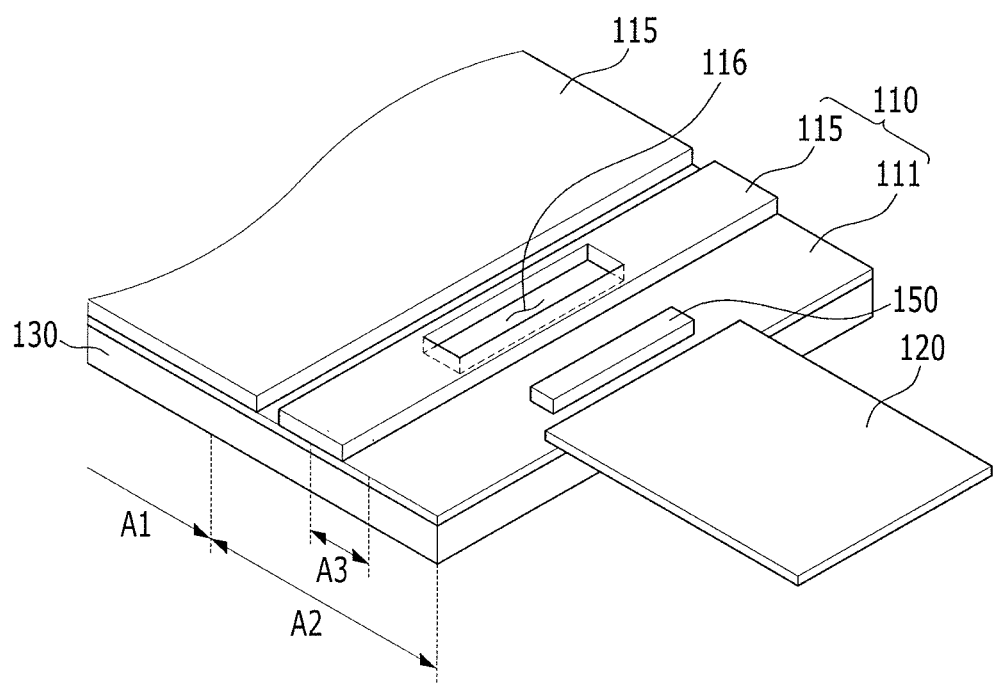
FIG. 24 to FIG. 26 illustrate stages in a bending process of a display device according to a second exemplary variation of an exemplary embodiment.
Figure 25:
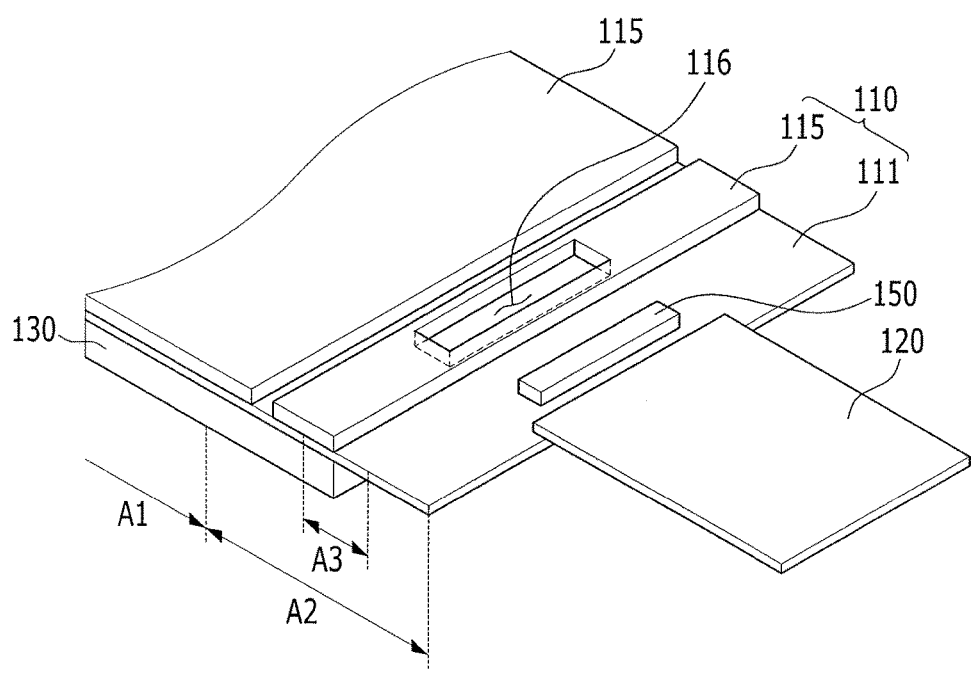
Figure 26:
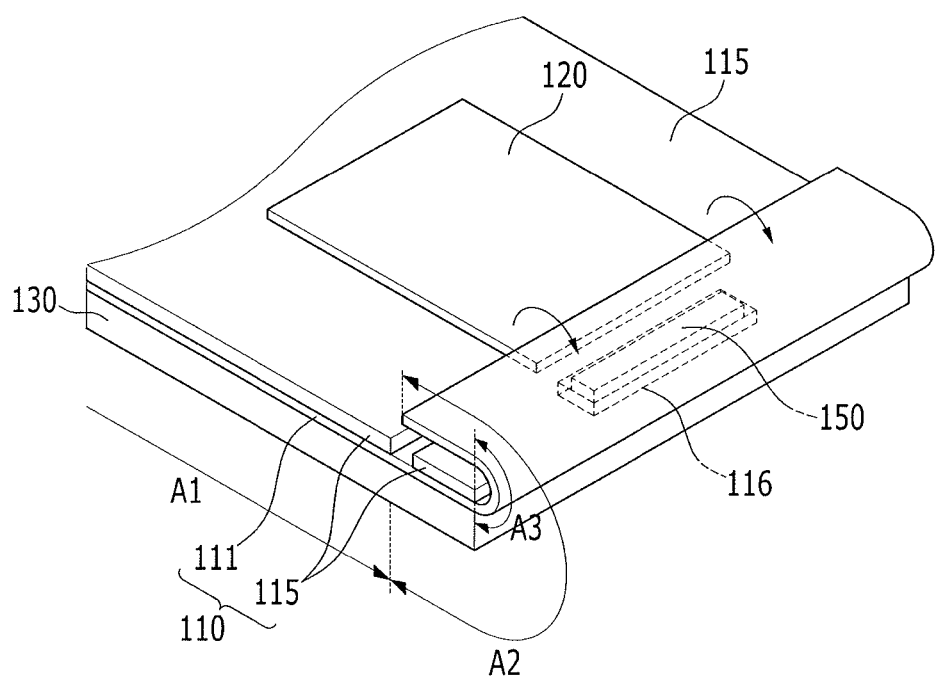
Figure 27:
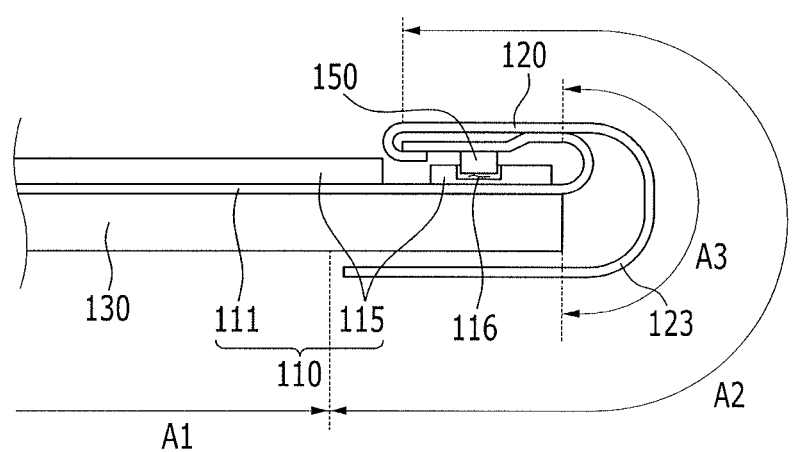
FIG. 27 illustrates an enlarged view of a first side of FIG. 26.

FIG. 24 to FIG. 26 show stages in a bending process of a display device according to another exemplary embodiment, and FIG. 27 shows one enlarged side view of FIG. 26. FIG. 24 to FIG. 27 show an exemplary variation for removing the insulating layer 115 in the area corresponding to the third area A3, while part of the insulating layer 115 in the second area A2 is maintained. As shown in FIG. 24 to FIG. 27, when the thickness of the bent third area A3 is reduced by removing part of the insulating layer 115 in the second area A2, generation of the stress by the bending may be reduced, thereby preventing damage to the display panel 110 caused by the stress.

By way of summation and review, to display an image on an entire screen, i.e., to increase a size of an image displayed on a screen, efforts have been made to reduce a non-display area on the screen of the display device. For example, when the non-display area is reduced, the display area is generated over the whole area of the display device, it is easier to realize a wide screen by connecting a plurality of display devices, it may be applied to various types of displays, e.g., transparent displays, foldable displays, or rollable displays, and it may be applicable to other fields. However, as components, e.g., circuit wires and driving chips, connected to the outside to supply electrical signals and voltages to the display area are provided in the non-display area, the non-display area may not be completely removed from the display panel or separated from the display area.

In contrast, example embodiments provide a display device with a reduced non-display area, i.e., reduced dead space, and a manufacturing method thereof. That is, according to embodiments, a display device includes a display panel with a bent edge and a flexible PCB that bends multiple times to overlap the different surfaces of the bent edge of the display panel, thereby reducing the non-display area, i.e., the dead space excluding the display, while maintain sufficient space to accommodate the flexible PCB for electrical connections.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
    a display panel including:
        a first area having a plurality of pixels on a first surface of a substrate,
        a second area having a plurality of pads on the first surface of the substrate, and
        a third area that is a part of the second area, the third area having a part of a second surface of the substrate bent toward the first surface of the substrate; and
    a flexible printed circuit board (PCB) including:
        a first bent portion in the second area of the display panel, the first bent portion contacting and electrically connected to the plurality of pads on the first surface of the substrate, the first bent portion being bent from an inside of the display panel toward an external side of the display panel so as to wrap around an edge of the display panel, and
        a second bent portion extending from the first bent portion, the second bent portion wrapping an external side of the second area and being bent toward the inside of the display panel from the external side of the display panel to contact the second surface of the substrate.

2. The display device as claimed in claim 1, further comprising a passivation layer on the second surface of the substrate.

3. The display device as claimed in claim 2, wherein the passivation layer overlaps the first area.

4. The display device as claimed in claim 2, wherein the passivation layer overlaps at least part of the first area and at least part of the second area.

5. The display device as claimed in claim 1, wherein the display panel includes a lateral surface connecting the first surface and the second surface, an adhesive portion being on the lateral surface in the third area.

6. The display device as claimed in claim 5, wherein the adhesive portion includes at least one of an epoxy resin, an acryl-based resin, a silicon-based resin, and a urethane-based resin.

7. The display device as claimed in claim 1, further comprising a window on the display panel so as to protect the display panel.

8. The display device as claimed in claim 7, wherein the window includes a recess facing the display panel, parts of the second area, the third area, the first bent portion, and the second bent portion being accommodated in the recess.

9. The display device as claimed in claim 1, further comprising a driving chip electrically connected to the pads.

10. The display device as claimed in claim 9, wherein the driving chip is on the flexible printed circuit board (PCB).

11. The display device as claimed in claim 9, wherein the driving chip is in the second area.

12. The display device as claimed in claim 11, wherein the second area includes:
    a plurality of insulating layers extending from the first area; and
    a receiving groove on the insulating layer and receiving the driving chip.

13. The display device as claimed in claim 1, wherein the first bent portion and the second bent portion of the flexible PCB are continuous with each other and wrap around different ends of the second area.

14. The display device as claimed in claim 13, wherein each of the first bent portion and the second bent portion includes a curved portion wrapped around a respective end of the second area, and an open portion opposite a respective curved portion, the open portions of the first bent portion and the second bent portion facing each other.

15. The display device as claimed in claim 13, wherein the first bent portion and the second bent portion at least partially overlap each other.

* * * * *